(12) United States Patent
Hsieh et al.

(10) Patent No.: US 8,193,647 B2
(45) Date of Patent: Jun. 5, 2012

(54) SEMICONDUCTOR DEVICE PACKAGE WITH AN ALIGNMENT MARK

(75) Inventors: Chuehan Hsieh, Kaohsiung (TW); Hung-Jen Yang, Kaohsiung (TW); Min-Lung Huang, Kaohsiung (TW)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 86 days.

(21) Appl. No.: 12/683,421

(22) Filed: Jan. 6, 2010

(65) Prior Publication Data
US 2011/0018118 A1 Jan. 27, 2011

(30) Foreign Application Priority Data
Jul. 21, 2009 (TW) .............................. 98124625 A (51) Int. Cl.
*H01L 23/544* (2006.01)
*H01L 21/76* (2006.01)
(52) U.S. Cl. ................. 257/797; 257/E23.179; 438/401
(58) Field of Classification Search .................. None
See application file for complete search history.

(56) References Cited

U.S. PATENT DOCUMENTS

| | | | |
|---|---|---|---|
| 3,959,874 A | 6/1976 | Coucoulas | |
| 4,783,695 A | 11/1988 | Eichelberger et al. | |
| 5,019,535 A | 5/1991 | Wojnarowski et al. | |
| 5,091,769 A | 2/1992 | Eichelberger | |
| 5,111,278 A | 5/1992 | Eichelberger | |
| 5,120,678 A | 6/1992 | Moore et al. | |
| 5,149,662 A | 9/1992 | Eichelberger | |
| 5,151,776 A | 9/1992 | Wojnarowski et al. | |
| 5,157,589 A | 10/1992 | Cole, Jr. et al. | |
| 5,225,023 A | 7/1993 | Wojnarowski et al. | |
| 5,241,456 A | 8/1993 | Marcinkiewicz et al. | |
| 5,250,843 A | 10/1993 | Eichelberger | |
| 5,315,486 A | 5/1994 | Fillion et al. | |
| 5,324,687 A | 6/1994 | Wojnarowski | |
| 5,353,195 A | 10/1994 | Fillion et al. | |
| 5,353,498 A | 10/1994 | Fillion et al. | |
| 5,422,513 A | 6/1995 | Marcinkiewicz et al. | |
| 5,519,936 A | 5/1996 | Andros et al. | |
| 5,527,741 A | 6/1996 | Cole et al. | |
| 5,546,654 A | 8/1996 | Wojnarowski et al. | |

(Continued)

OTHER PUBLICATIONS

Ding et al., U.S. Appl. No. 12/753,840, filed Apr. 2, 2010 for "Semiconductor Device Packages with Fan-Out and with Connecting Elements for Stacking and Manufacturing Methods Thereof".

(Continued)

*Primary Examiner* — Alonzo Chambliss
(74) *Attorney, Agent, or Firm* — Foley & Lardner LLP (57) ABSTRACT

A semiconductor device package includes a semiconductor device, a sealant, a first dielectric layer, an electrically conductive layer, and a second dielectric layer. The semiconductor device includes a contact pad, an active surface, and side surfaces, where the contact pad is disposed adjacent to the active surface. The semiconductor device is formed with a first alignment mark that is disposed adjacent to the active surface. The sealant envelopes the side surfaces of the semiconductor device and exposes the contact pad. The first dielectric layer is disposed adjacent to the sealant and the active surface, and defines a first aperture that exposes the contact pad. The electrically conductive layer is disposed adjacent to the first dielectric layer and is electrically connected to the contact pad through the first aperture. The second dielectric layer is disposed adjacent to the electrically conductive layer.

17 Claims, 10 Drawing Sheets

U.S. PATENT DOCUMENTS

| | | | |
|---|---|---|---|
| 5,554,887 A | 9/1996 | Sawai et al. | |
| 5,567,656 A | 10/1996 | Chun | |
| 5,703,400 A | 12/1997 | Wojnarowski et al. | |
| 5,710,062 A | 1/1998 | Sawai et al. | |
| 5,745,984 A | 5/1998 | Cole, Jr. et al. | |
| 5,834,340 A | 11/1998 | Sawai et al. | |
| 5,841,193 A | 11/1998 | Eichelberger | |
| 5,866,952 A | 2/1999 | Wojnarowski et al. | |
| 6,046,071 A | 4/2000 | Sawai et al. | |
| 6,080,932 A | 6/2000 | Smith et al. | |
| 6,159,767 A | 12/2000 | Eichelberger et al. | |
| 6,232,151 B1 | 5/2001 | Ozmat et al. | |
| 6,239,482 B1 | 5/2001 | Fillion et al. | |
| 6,265,765 B1 | 7/2001 | DiStefano et al. | |
| 6,294,741 B1 | 9/2001 | Cole, Jr. et al. | |
| 6,306,680 B1 | 10/2001 | Fillion et al. | |
| 6,358,780 B1 | 3/2002 | Smith et al. | |
| 6,377,461 B1 | 4/2002 | Ozmat et al. | |
| 6,396,148 B1 | 5/2002 | Eichelberger et al. | |
| 6,426,545 B1 | 7/2002 | Eichelberger et al. | |
| 6,486,006 B2 | 11/2002 | Hirano et al. | |
| 6,555,908 B1 | 4/2003 | Eichelberger | |
| 6,680,529 B2 | 1/2004 | Chen et al. | |
| 6,701,614 B2 | 3/2004 | Ding et al. | |
| 6,818,544 B2 | 11/2004 | Eichelberger et al. | |
| 6,838,776 B2 | 1/2005 | Leal et al. | |
| 6,845,554 B2 | 1/2005 | Frankowsky et al. | |
| 6,921,683 B2 | 7/2005 | Nakayama | |
| 6,921,975 B2 | 7/2005 | Leal et al. | |
| 6,953,708 B2 | 10/2005 | Hedler et al. | |
| 7,015,075 B2 | 3/2006 | Fay et al. | |
| 7,045,908 B2 * | 5/2006 | Ohsumi | 257/797 |
| 7,048,450 B2 | 5/2006 | Beer et al. | |
| 7,087,991 B2 | 8/2006 | Chen et al. | |
| 7,091,595 B2 | 8/2006 | Fuergut et al. | |
| 7,112,467 B2 | 9/2006 | Eichelberger et al. | |
| 7,145,228 B2 | 12/2006 | Yean et al. | |
| 7,163,843 B2 | 1/2007 | Kiendl et al. | |
| 7,294,791 B2 | 11/2007 | Danoski et al. | |
| 7,344,917 B2 | 3/2008 | Gautham | |
| 7,361,987 B2 | 4/2008 | Leal et al. | |
| 7,364,944 B2 | 4/2008 | Huang et al. | |
| 7,371,617 B2 | 5/2008 | Tsai et al. | |
| 7,425,464 B2 | 9/2008 | Fay et al. | |
| 7,453,148 B2 | 11/2008 | Yang et al. | |
| 7,476,563 B2 | 1/2009 | Mangrum et al. | |
| 7,482,198 B2 | 1/2009 | Bauer et al. | |
| 7,501,310 B2 | 3/2009 | Yang et al. | |
| 7,511,365 B2 | 3/2009 | Wu et al. | |
| 7,514,767 B2 | 4/2009 | Yang | |
| 7,575,173 B2 | 8/2009 | Fuergut et al. | |
| 7,588,951 B2 | 9/2009 | Mangrum et al. | |
| 7,595,226 B2 | 9/2009 | Lytle et al. | |
| 7,619,304 B2 | 11/2009 | Bauer et al. | |
| 7,619,901 B2 | 11/2009 | Eichelberger et al. | |
| 7,622,733 B2 | 11/2009 | Fuergut et al. | |
| 7,655,501 B2 | 2/2010 | Yang et al. | |
| 7,662,667 B2 * | 2/2010 | Shen | 438/112 |
| 7,667,318 B2 | 2/2010 | Yang et al. | |
| 7,675,157 B2 | 3/2010 | Liu et al. | |
| 7,692,286 B1 | 4/2010 | Huemoeller et al. | |
| 7,714,431 B1 | 5/2010 | Huemoeller et al. | |
| 7,727,803 B2 * | 6/2010 | Yamagata | 438/107 |
| 7,732,242 B2 | 6/2010 | Brunnbauer et al. | |
| 7,741,151 B2 | 6/2010 | Amrine et al. | |
| 7,759,163 B2 | 7/2010 | Kroeninger et al. | |
| 7,763,976 B2 | 7/2010 | Tang et al. | |
| 7,767,495 B2 | 8/2010 | Fuergut et al. | |
| 7,812,434 B2 | 10/2010 | Yang | |
| 7,830,004 B2 | 11/2010 | Wu et al. | |
| 7,932,599 B2 | 4/2011 | Kiendl et al. | |
| 2004/0012099 A1 | 1/2004 | Nakayama | |
| 2006/0065387 A1 | 3/2006 | Tonapi et al. | |
| 2006/0231944 A1 | 10/2006 | Huang et al. | |
| 2007/0222054 A1 | 9/2007 | Hembree | |
| 2009/0102066 A1 | 4/2009 | Lee et al. | |
| 2009/0236686 A1 | 9/2009 | Shim et al. | |
| 2009/0261466 A1 | 10/2009 | Pagaila et al. | |
| 2010/0006330 A1 | 1/2010 | Fu et al. | |
| 2010/0006994 A1 | 1/2010 | Shim et al. | |
| 2010/0072599 A1 | 3/2010 | Camacho et al. | |
| 2010/0072618 A1 | 3/2010 | Camacho et al. | |
| 2010/0084759 A1 * | 4/2010 | Shen | 257/690 |
| 2010/0224983 A1 | 9/2010 | Huang et al. | |
| 2010/0308449 A1 | 12/2010 | Yang et al. | |
| 2010/0314746 A1 | 12/2010 | Hsieh et al. | |
| 2010/0320593 A1 | 12/2010 | Weng et al. | |
| 2011/0018124 A1 | 1/2011 | Yang et al. | |
| 2011/0115060 A1 | 5/2011 | Chiu et al. | |
| 2011/0127654 A1 | 6/2011 | Weng et al. | |
| 2011/0169150 A1 | 7/2011 | Su et al. | |
| 2011/0177654 A1 | 7/2011 | Lee et al. | |
| 2011/0194265 A1 | 8/2011 | Su et al. | |

OTHER PUBLICATIONS

Ding et al., U.S. Appl. No. 12/753,837, filed Apr. 2, 2010 for "Wafer-Level Semiconductor Device Packages with Stacking Functionality."

Chen et al., U.S. Appl. No. 12/753,843, filed Apr. 2, 2010 for "Stacked Semiconductor Device Package Assemblies with Reduced Wire Sweep and Manufacturing Methods Thereof."

Lee et al., U.S. Appl. No. 12/972,046, filed Dec. 17, 2010 for "Embedded Component Device and Manufacturing Methods Thereof."

Hunt et al., U.S. Appl. No. 12/944,697, filed Nov. 11, 2010 for "Wafer Level Semiconductor Package and Manufacturing Methods Thereof."

Chen et al., U.S. Appl. No. 12/874,144, filed Sep. 1, 2010 for "Stackable Semiconductor Package and Manufacturing Method Thereof."

* cited by examiner

SEMICONDUCTOR DEVICE PACKAGE WITH AN ALIGNMENT MARK

CROSS REFERENCE TO RELATED APPLICATION

This application claims the benefit of Taiwan Application Serial No. 98124625, filed on Jul. 21, 2009, the disclosure of which is incorporated herein by reference in its entirety.

FIELD OF THE INVENTION

The disclosure relates, in general, to semiconductor device packages and, more particularly, to semiconductor device packages and redistribution structures including alignment marks and manufacturing methods thereof.

BACKGROUND

Unlike conventional packaging technology that processes a single chip at a time, advanced wafer-level packaging technology can process an entire redistribution structure. In other words, multiple chips included in the redistribution structure can be processed together before the chips are separated individually, hence simplifying a back-end process of chip packaging and reducing manufacturing time and cost. That is, the back-end process can be applied to the entire redistribution structure, and then the redistribution structure can be sawn into multiple, individual semiconductor device packages. In view of these benefits, advanced wafer-level packaging technology is becoming a mainstream technology of semiconductor device packages.

During the fabrication of a redistribution structure, multiple devices can be sawn from a wafer and positioned on a carrier. The devices can include multiple chips with circuit functionality and multiple alignment dies. In a subsequent exposure process, a mask alignment tool can position a mask to perform an exposure process for forming a dielectric layer or an electrically conductive layer on the redistribution structure surface, according to the alignment dies included in the redistribution structure. Unfortunately, the devices on the carrier may be misplaced or may be displaced during the fabrication of the redistribution structure, and an alignment bias can result from such misplacement or displacement. In some instances, the alignment bias can be as high as +/−10 µm. As a result, a fabricated pattern, such as a pattern of a dielectric layer or an electrically conductive layer, can be displaced to an undesirable extent, relative to its intended position in the absence of an alignment bias.

Figure 1:
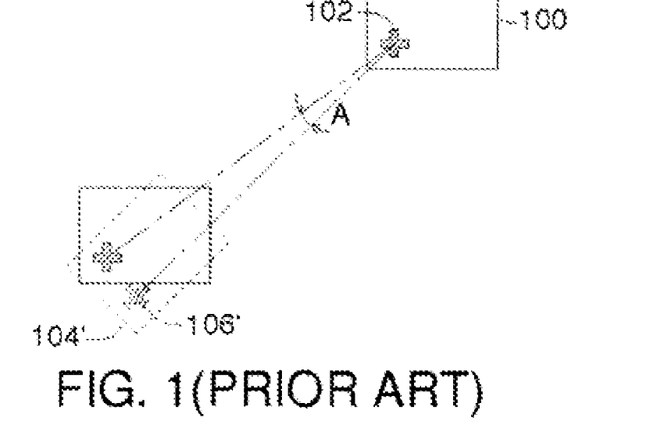
FIG. 1 shows an alignment bias that can result from the use of alignment dies in accordance with a conventional approach.

Referring to FIG. 1, an alignment bias that can result from the use of alignment dies 100 and 104' is shown in accordance with a conventional approach. After the alignment dies 100 and 104' are positioned on a carrier, a rotational bias can occur, yielding a bias angle A between an alignment mark 102 on the alignment die 100 and an alignment mark 106' on the alignment die 104'. The off-center positioning of the alignment mark 102 on the alignment die 100 and the off-center positioning of the alignment mark 106' on the alignment die 104' exacerbates the extent of the bias angle A and its resulting effects on fabricated patterns. In a subsequent exposure process, a mask alignment tool can position a mask according to the alignment mark 102 and the alignment mark 106', which are already biased. As such, the mask is positioned so as to generate a rotational bias, and the resulting fabricated patterns can be significantly displaced relative to their intended positions.

It is against this background that a need arose to develop the semiconductor device packages, redistribution structures, and manufacturing methods described herein.

SUMMARY

The disclosure is directed to semiconductor device packages and redistribution structures including alignment marks and manufacturing methods thereof. According to some embodiments, an alignment mark is formed adjacent to a geometric center of a semiconductor device, such as an alignment die or a chip, so that a relative position between the alignment mark and another alignment mark is less affected by a rotational bias during the fabrication of a redistribution structure. In such manner, a mask and the alignment marks can be more precisely aligned in an exposure process, and a resulting pattern can be fabricated with a higher level of dimensional precision.

One aspect of the disclosure relates to semiconductor device packages. In one embodiment, a semiconductor device package includes: (1) a semiconductor device including a contact pad, an active surface, and side surfaces, wherein the contact pad is disposed adjacent to the active surface, and the semiconductor device is formed with a first alignment mark that is disposed adjacent to a geometric center of the active surface; (2) a sealant enveloping the side surfaces of the semiconductor device and exposing the contact pad; (3) a first dielectric layer disposed adjacent to the sealant and the active surface, wherein the first dielectric layer defines a first aperture that exposes the contact pad; (4) an electrically conductive layer disposed adjacent to the first dielectric layer and electrically connected to the contact pad through the first aperture; and (5) a second dielectric layer disposed adjacent to the electrically conductive layer.

Another aspect of the disclosure relates to manufacturing methods. In one embodiment; a manufacturing method includes: (1) providing a carrier and an adhesion layer disposed adjacent to the carrier; (2) positioning semiconductor devices adjacent to the adhesion layer, wherein each of the semiconductor devices includes an active surface, side surfaces, and a contact pad disposed adjacent to the active surface, the active surfaces of the semiconductor devices face the adhesion layer, the semiconductor devices include a first semiconductor device and a second semiconductor device, the first semiconductor device includes a first alignment mark disposed adjacent to a geometric center of the active surface of the first semiconductor device, and the second semiconductor device includes a second alignment mark disposed adjacent to a geometric center of the active surface of the second semiconductor device; (3) enveloping the side surfaces of the semiconductor devices with a sealant to form a redistribution structure; (4) removing the carrier and the adhesion layer, so that the redistribution structure exposes the contact pads of the semiconductor devices; (5) using the first alignment mark and the second alignment mark as a positioning reference, forming a first dielectric layer adjacent to the sealant and the active surfaces of the semiconductor devices, wherein the first dielectric layer defines first apertures that expose respective ones of the contact pads of the semiconductor devices; (6) forming an electrically conductive layer adjacent to the first dielectric layer and electrically connected to the contact pads of the semiconductor devices through the first apertures; (7) forming a second dielectric layer adjacent to the electrically conductive layer, wherein the second dielectric layer defines second apertures that expose contact surfaces of the electrically conductive layer; (8) positioning conductive bumps adjacent to the second dielectric layer, so that the conductive bumps are electrically connected to the electrically conductive layer through the second apertures; and (9) singulating the redistribution structure to form semiconductor device packages.

In another embodiment, a manufacturing method includes: (1) providing a carrier; (2) providing semiconductor devices, wherein each of the semiconductor devices includes an active surface, side surfaces, and a contact pad disposed adjacent to the active surface, the semiconductor devices include a first semiconductor device and a second semiconductor device, the first semiconductor device includes a first alignment mark disposed adjacent to a geometric center of the active surface of the first semiconductor device, and the second semiconductor device includes a second alignment mark disposed adjacent to a geometric center of the active surface of the second semiconductor device; (3) positioning the semiconductor devices adjacent to the carrier, so that the active surfaces of the semiconductor devices face the carrier; (4) enveloping the side surfaces of the semiconductor devices with a sealant to form a redistribution structure; and (5) removing the carrier, so that the redistribution structure exposes the contact pads of the semiconductor devices.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

DETAILED DESCRIPTION

Definitions

The following definitions apply to some of the aspects described with respect to some embodiments of the disclosure. These definitions may likewise be expanded upon herein.

As used herein, the singular terms "a," "an," and "the" include plural referents unless the context clearly dictates otherwise. Thus, for example, reference to an alignment mark can include multiple alignment marks unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another, such as in accordance with the drawings, but do not require a particular orientation of those components during manufacturing or use.

As used herein, the terms "connect," "connected," and "connection" refer to an operational coupling or linking. Connected components can be directly coupled to one another or can be indirectly coupled to one another, such as through another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing methods described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("S·m$^{-1}$"). Typically, an electrically conductive material is one having a conductivity greater than about $10^4$ S·m$^{-1}$, such as at least about $10^5$ S·m$^{-1}$ or at least about $10^6$ ·Sm$^{-1}$. Electrical conductivity of a material can sometimes vary with temperature. Unless otherwise specified, electrical conductivity of a material is defined at room temperature.

Figure 2A:
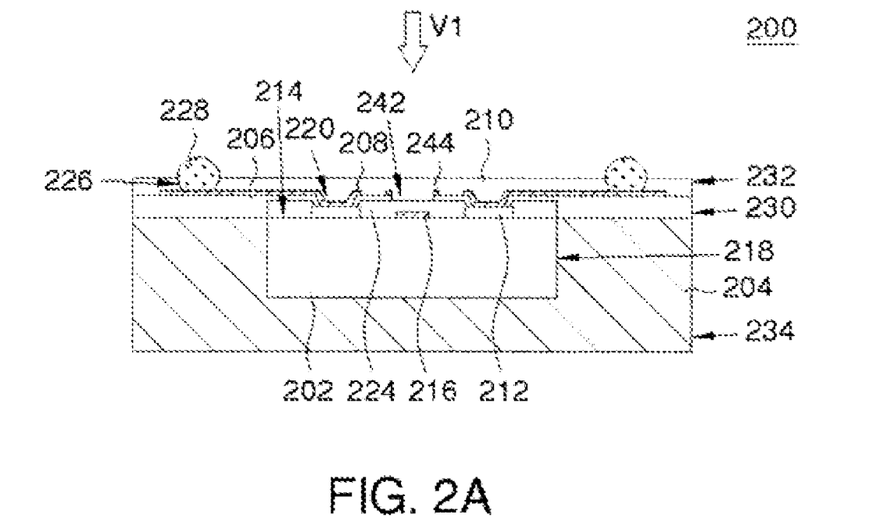
FIG. 2A shows a semiconductor device package according to an embodiment of the disclosure.

Referring to FIG. 2A, a semiconductor device package 200 according to a first embodiment of the disclosure is shown. The semiconductor package 200 includes a semiconductor device 202 (e.g., a semiconductor chip), a sealant or a package body 204 (e.g., formed of a molding compound), a first, patterned dielectric layer 206, a patterned electrically conductive layer 208, and a second, patterned dielectric layer 210. The electrically conductive layer 208 can be, for example, a redistribution layer ("RDL"). While three layers are shown in FIG. 2A, it is contemplated that more or less layers can be included for other embodiments.

The chip 202, having an active surface 214, includes multiple contact pads 212, a passivation layer 224, and an alignment mark 216. The pads 212 and the alignment mark 216 are disposed adjacent to the active surface 214. The passivation layer 224 is also disposed adjacent to the active surface 214, covers the alignment mark 216, and defines or is otherwise formed with apertures or openings that are aligned with respective ones of the pads 212 so as to expose the pads 212. The passivation layer 224 is formed from a transparent or translucent material.

The alignment mark 216 is located adjacent to a geometric center of the active surface 214 of the chip 202, such as substantially at the geometric center of the active surface 214. More particularly, the alignment mark 216, having a geometric center (as viewed from the top), is located such that the geometric center of the alignment mark 216 is substantially co-located with the geometric center of the active surface 214. As can be appreciated, a geometric center of a surface can correspond to a centroid of that surface, namely an intersection of all straight lines that each divide that surface into two parts of equal moment about the line. In the illustrated embodiment, the substantial co-location of the geometric center of the alignment mark 216 and the geometric center of the active surface 214 is such that a separation between the geometric centers along a direction parallel to a width of the active surface 214 is no greater than 20 percent relative to the width, such as no greater than 15 percent, no greater than 10 percent, or no greater than 5 percent, and a separation between the geometric centers along a direction parallel to a length of the active surface 214 is no greater than 20 percent relative to the length, such as no greater than 15 percent, no greater than 10 percent, or no greater than 5 percent.

The sealant 204 covers or envelops side surfaces 218 and a bottom surface of the chip 202, while exposing the active surface 214. It is also contemplated that the sealant 204 can cover the side surfaces 218 of the chip 202, while exposing both the active surface 214 and the bottom surface of the chip 202. The sealant 204 can be formed from a molding material, such as a Novolac-based resin, an epoxy-based resin, a silicone-based resin, or another suitable encapsulant. Suitable fillers also can be included, such as powdered $SiO_2$.

The first dielectric layer 206 is formed adjacent to the sealant 204 and the passivation layer 224, that is, above the active surface 214. The first dielectric layer 206 defines or is otherwise formed with first apertures 220 that are aligned with respective ones of the pads 212 so as to expose the pads 212. Also, the first dielectric layer 206 defines or is otherwise formed with an alignment mark 242, which is further described below. The first dielectric layer 206 can be formed from a dielectric material that is non-polymeric or polymeric, such as polyimide, polybenzoxazole, benzocyclobutene, or a combination thereof. For example, the first dielectric layer 206 can be formed from a dielectric material that is photoimageable or photoactive, thereby reducing manufacturing cost and time by allowing patterning using photolithography, and a thickness of the first dielectric layer 206 can be in the range of about 1 µm to about 12 µm, such as from about 1 µm to about 10 µm or from about 2 µm to about 6 µm.

The electrically conductive layer 208 is formed adjacent to a portion of the first dielectric layer 206 and extends into the first apertures 220 so as to be electrically connected to the pads 212. Also, the electrically conductive layer 208 defines or is otherwise formed with an alignment mark 244, which is further described below. The electrically conductive layer 208 can be formed from a metal, a metal alloy, a matrix with a metal or a metal alloy dispersed therein, or another suitable electrically conductive material. For example, the electrically conductive layer 208 can be formed from aluminum, copper, titanium, or a combination thereof, and a thickness of the electrically conductive layer 208 can be in the range of about 1 µm to about 12 µm, such as from about 1 µm to about 10 µm or from about 2 µm to about 6 µm.

One or more of the alignment marks 216, 242, and 244 can be used to provide a positioning reference to form the dielectric layer 206, the electrically conductive layer 208, and the dielectric layer 210, and to increase the precision in sizing and patterning of those layers 206, 208, and 210. In general, the alignment marks 216, 242, and 244 can be implemented as visual cues or any other detectable or measured cues to aid the positioning of a mask, such as by an exposing tool. For example, the alignment marks 216, 242, and 244 can be implemented in the form of surface patterning or other deviations from planarity, such as a set of recesses, a set of protrusions, or both.

Figure 2B:
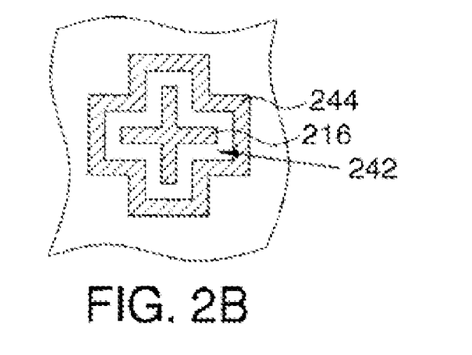
FIG. 2B shows the semiconductor device package of FIG. 2A, as viewed along direction V1 and in accordance with an embodiment of the disclosure.

Referring to FIG. 2B, the alignment marks 216, 242, and 244 of FIG. 2A viewed in a direction V1 are shown. A boundary or silhouette of the alignment mark 216 is cross-shaped in the illustrated embodiment. Silhouettes and locations of the alignment marks 242 and 244 substantially correspond to that of the alignment mark 216, wherein the alignment mark 216 is formed as a protrusion, the alignment mark 242 is formed as a recess surrounding the silhouette of the alignment mark 216, and the alignment mark 244 is formed as a protrusion (e.g., a metallization ring) that surrounds the silhouette of the alignment mark 242.

The second dielectric layer 210 is formed adjacent to the electrically conductive layer 208. The second dielectric layer 210 defines or is otherwise formed with second apertures 226 that are sized to accommodate conductive bumps 228 (e.g., solder balls) and are aligned with respect to the electrically conductive layer 208 so as to expose contact surfaces of the electrically conductive layer 208. Like the first dielectric layer 206, the second dielectric layer 210 can be formed from a dielectric material that is non-polymeric or polymeric, such as polyimide, polybenzoxazole, benzocyclobutene, or a combination thereof. For example, the second dielectric layer 210 can be formed from a dielectric material that is photoimageable or photoactive, thereby reducing manufacturing cost and time by allowing patterning using photolithography, and a thickness of the second dielectric layer 210 can be in the range of about 1 µm to about 12 µm, such as from about 1 µm to about 10 µm or from about 2 µm to about 6 µm.

The solder balls 228 are electrically connected to the pads 212 through contact surfaces on the electrically conductive layer 208. In accordance with a fan-out configuration of the semiconductor package 200, at least a portion or a subset of the solder balls 228 (and at least a portion or a subset of the second apertures 226) are laterally disposed outside of a periphery of the chip 202 (as defined by the side surfaces 218) and overlapping the sealant 204 (as viewed from the direction V1), although it is contemplated that the solder balls 228, in general, can be laterally disposed within that periphery, outside of that periphery, or both. In such manner, the fan-out configuration of the semiconductor package 200 allows a greater number of the solder balls 228 as well as a greater flexibility in terms of the arrangement and spacing of the solder balls 228, with reduced dependence upon the arrangement and spacing of the pads 212 of the chip 202.

In this embodiment of the disclosure, side surfaces 230 of the first dielectric layer 206 are substantially aligned with respective side surfaces 232 of the second dielectric layer 210, which are substantially aligned with respective side surfaces 234 of the sealant 204, thereby defining substantially co-planar side surfaces adjacent to four sides of the semiconductor package 200. However, it is contemplated that the extent of alignment and co-planarity can be varied for other embodiments.

Figure 3:
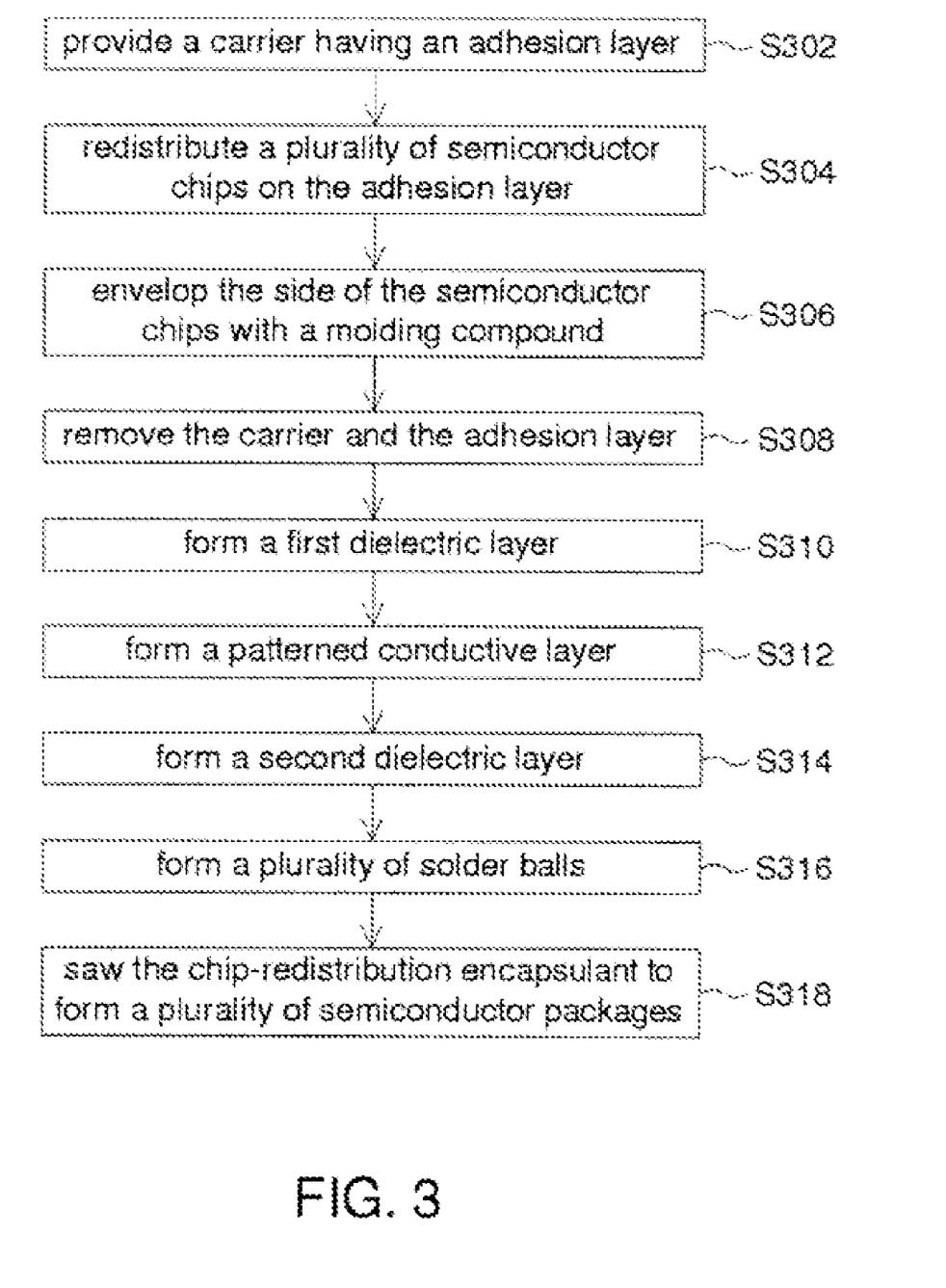
FIG. 3 shows a flow chart of a manufacturing method to form the semiconductor device package of FIG. 2A, according to an embodiment of the disclosure.

Referring to FIG. 3, a manufacturing method of the semiconductor package 200 according to the first embodiment of the disclosure is shown. Referring to FIG. 4A through FIG. 4I, various operations or stages of the manufacturing method are shown.

Figure 4:
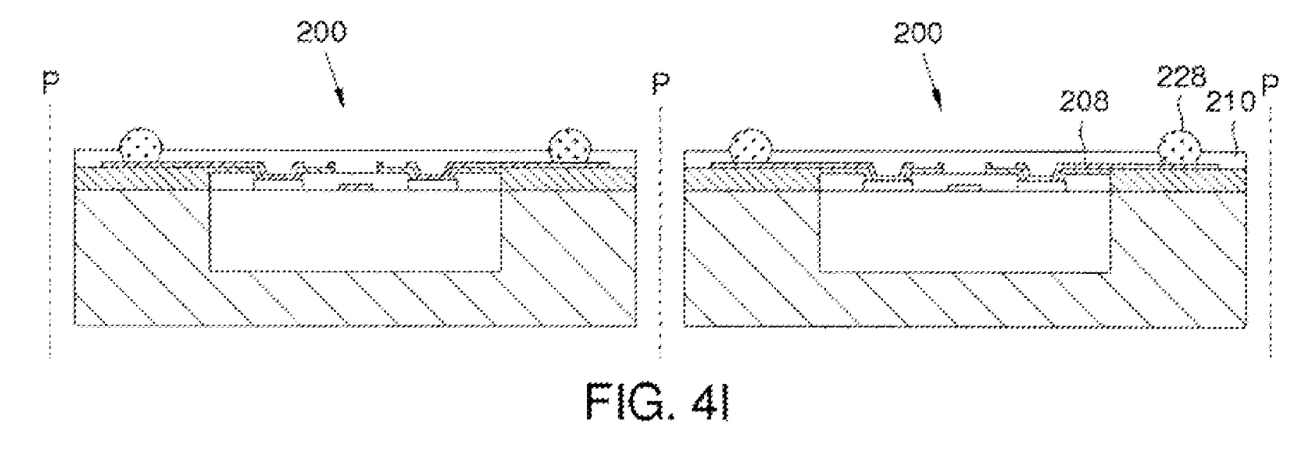
FIG. 4A through FIG. 4I show operations of a manufacturing method to form the semiconductor device package of FIG. 2A, according to an embodiment of the disclosure.
Figure 4A:
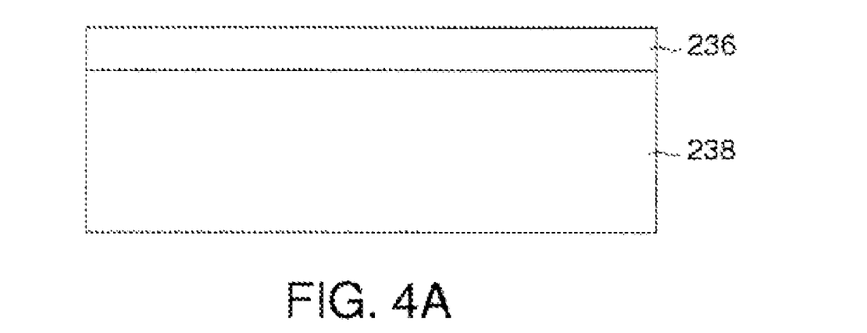

In operation S302, as indicated in FIG. 3 and FIG. 4A, a carrier 238 is provided, and an adhesion layer 236 is positioned adjacent to a top surface of the carrier 238. The adhesion layer 236 can be implemented as a single-sided or double-sided adhesive tape.

Figure 4B:
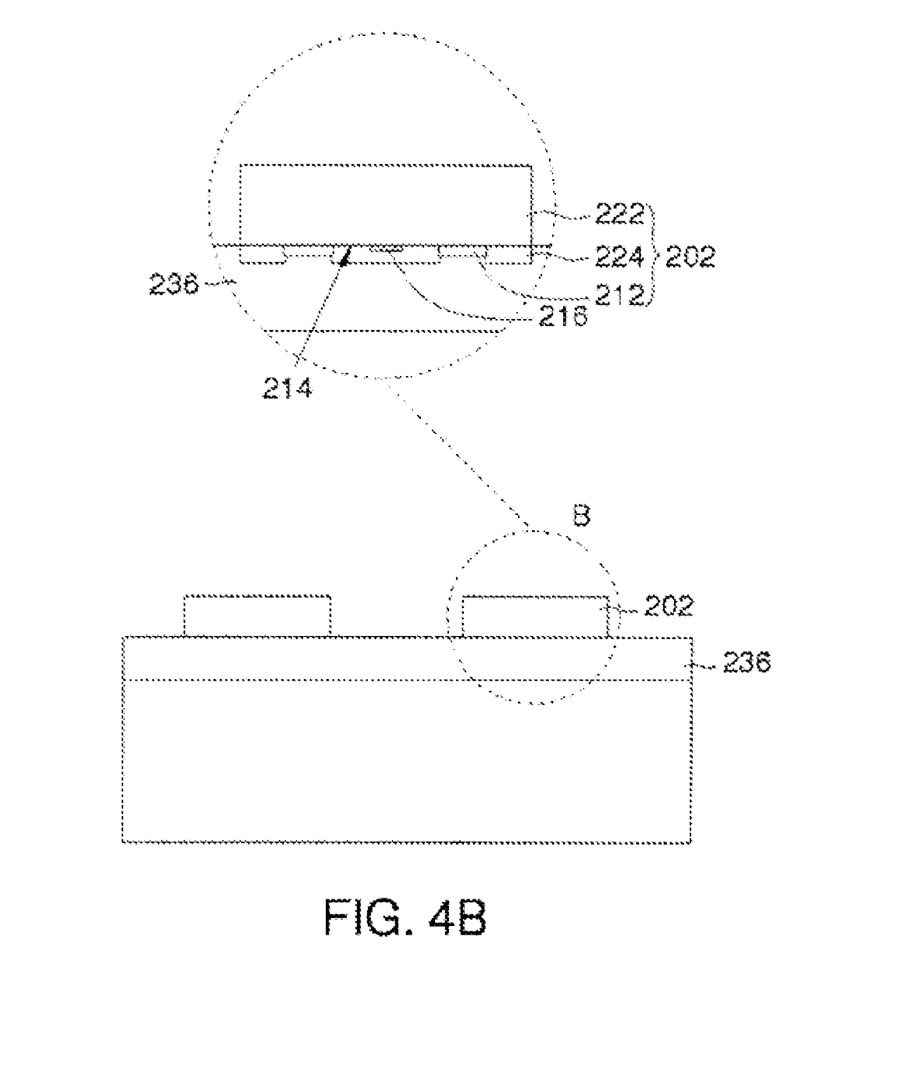

In operation S304, as indicated in FIG. 3 and FIG. 4B, multiple chips 202 are positioned adjacent to the adhesion layer 236, thereby redistributing the chips 202 adjacent to the adhesion layer 236. As indicated in the enlarged view of a local area B of FIG. 4B, each chip 202 includes multiple contact pads 212, a passivation layer 224, an active surface 214, and a body 222. The pads 212 are disposed adjacent to the active surface 214, wherein the active surface 214 faces the adhesion layer 236. The chips 202, originally formed in a wafer (not illustrated), are sawn from the wafer and then redistributed on the carrier 238.

Figure 5:
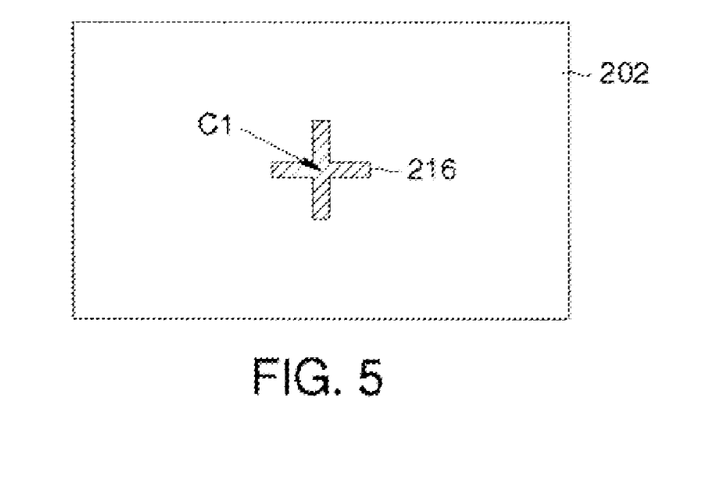
FIG. 5 shows a top view of a chip of FIG. 4B, according to an embodiment of the disclosure.

At least two of the chips 202 each has an alignment mark 216 located substantially at a geometric center of a corresponding active surface 214. Referring to FIG. 5, a top view of the chip 202 of FIG. 4B is shown. To avoid complexity, the alignment mark 216 is illustrated in FIG. 5, while certain other details are omitted. The active surface 214 of the chip 202 is a rectangle, for example, and the alignment mark 216 is located substantially at a geometric center C1 of the rectangle. Thus, even if the redistributed chip 202 is rotated, such as about the geometric center C1, a resulting bias angle can be mitigated so as to avoid incurring severe bias in subsequent patterns being manufactured.

In the present embodiment of the disclosure, the alignment marks 216 are formed on at least two of the chips 202 having circuit function, rather than on alignment dies lacking circuit function. Thus, during the manufacturing of a wafer, the chips 202 can be formed in the space originally reserved for the formation of the alignment dies, so that more chips and semiconductor packages can be obtained according to the present embodiment of the disclosure.

A silhouette of the alignment mark 216 is exemplified by a cross in FIG. 5. However, in other implementations, the alignment mark 216 can be in other shapes as long as a mask can be precisely aligned, and the silhouette of the alignment mark 216 is not limited to the example disclosed in the present embodiment of the disclosure.

Figure 4C:
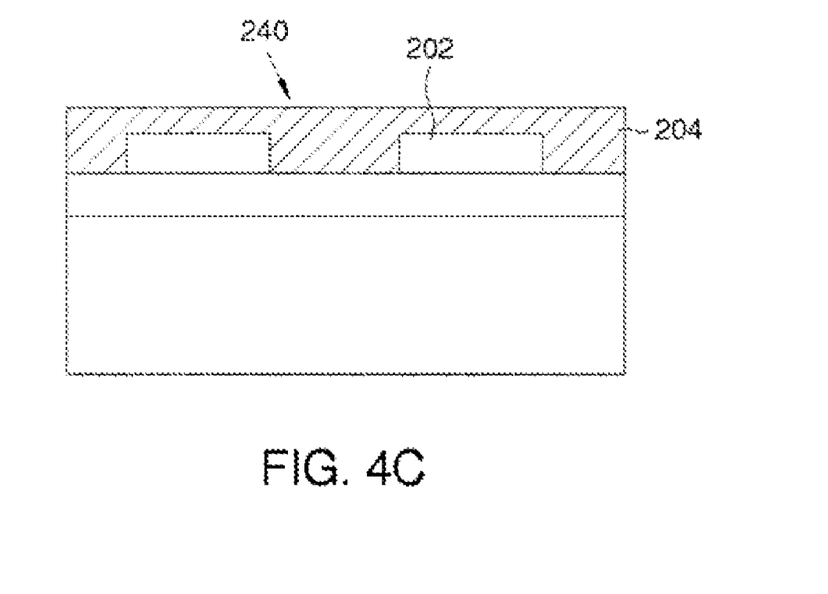

Then, in operation S306, as indicated in FIG. 3 and FIG. 4C, side surfaces 218 of each chip 202 are covered or enveloped with a sealant 204, so that the sealant 204 and the chips 202 form a redistribution structure 240, which can also be referred to as a reconstituted wafer.

Figure 4D:
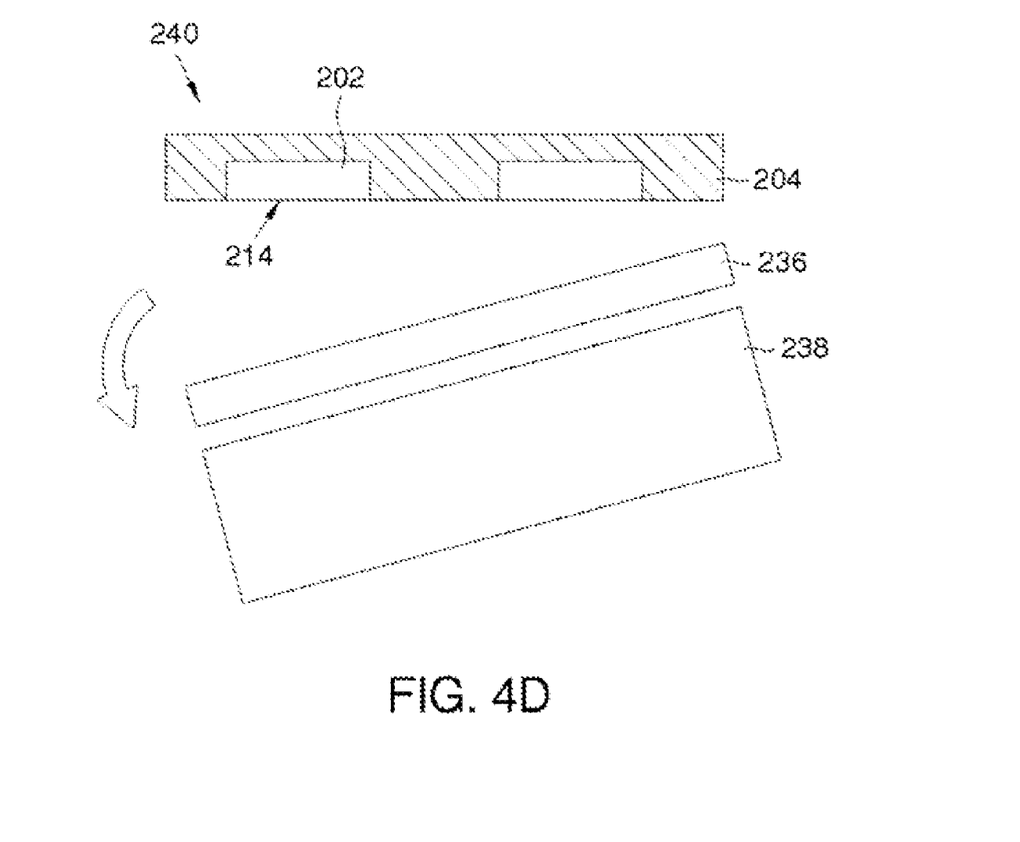

After that, in operation S308, as indicated in FIG. 3 and FIG. 4D, the carrier 238 and the adhesion layer 236 are removed or separated, so that the redistribution structure 240 exposes the active surfaces 214 of the chips 202. In FIG. 4D, the active surfaces 214 face downwards. By inverting the redistribution structure 240, the active surfaces 214 face upwards as indicated in FIG. 4E.

Figures 4E, 4F:
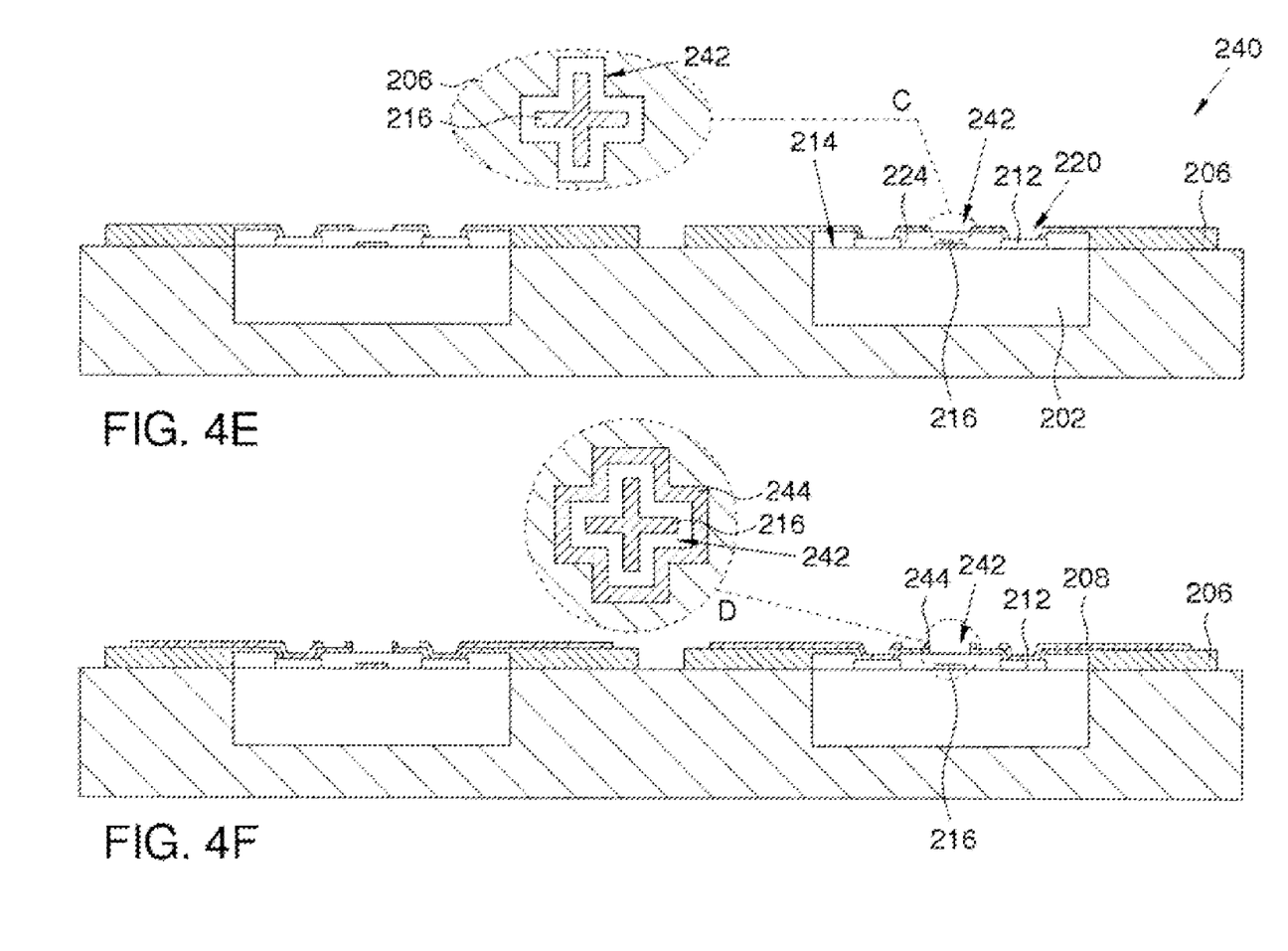

After that, in operation S310, as indicated in FIG. 3 and FIG. 4E, a mask alignment tool (not illustrated) references the alignment marks 216 to position a mask at an exposure position to form a first dielectric layer 206 on the sealant 204 and the passivation layers 224 of the chips 202, that is, above the active surfaces 214. In operation S310, multiple, first apertures 220 are formed in the first dielectric layer 206 to expose the pads 212.

During the formation of the first dielectric layer 206, at least one alignment mark 242 is concurrently formed in the first dielectric layer 206. The alignment mark 242 is a recess, and the size of the recess is larger than the silhouette of the alignment mark 216, so that the alignment mark 216 is exposed by the recess. Thus, in the next exposing process, a mask can be aligned according to the alignment mark 216 or the alignment mark 242.

During the formation of the first dielectric layer 206, in order to be aligned with the alignment mark 216, the silhouette and location of an alignment pattern (not illustrated) on a mask can correspond to that of the alignment mark 216. For example, the silhouette of the alignment pattern on the mask and the silhouette, of the alignment mark 216 can be both cross-shaped. Furthermore, during the formation of the first dielectric layer 206, the alignment mark 242, which correspond to the alignment pattern on the mask, can be concurrently formed in the first dielectric layer 206. Thus, the silhouette and location of the alignment mark 242 can also correspond to that of the alignment mark 216, as indicated in an enlarged top view of a local area C of FIG. 4E.

The alignment mark 242, such as a recess extending at least partially through the first dielectric layer 206, can expose an underlying structure, such as the passivation layer 224 that is under the first dielectric layer 206.

Then, in operation S312, as indicated in FIG. 3 and FIG. 4F, an electrically conductive layer 208 is formed adjacent to the first dielectric layer 206 and is electrically connected to the pads 212.

In operation S312, a mask alignment tool (not illustrated) references either, or both, the alignment marks 216 and 242 to position a mask at an exposure position to form the electrically conductive layer 208.

During the formation of the electrically conductive layer 208, in order to be aligned with the alignment mark 216 or the alignment mark 242, the silhouette and location of an alignment pattern (not illustrated) on a mask can correspond to that of the alignment mark 216 or the alignment mark 242. Moreover, during the formation of the electrically conductive layer 208, at least one alignment mark 244, which correspond to the alignment pattern on the mask, can be concurrently formed in the electrically conductive layer 208. Thus, a silhouette and location of the alignment mark 244 can also correspond to that of the alignment mark 216, as indicated in an enlarged top view of a local area D of FIG. 4F.

Figure 4G:
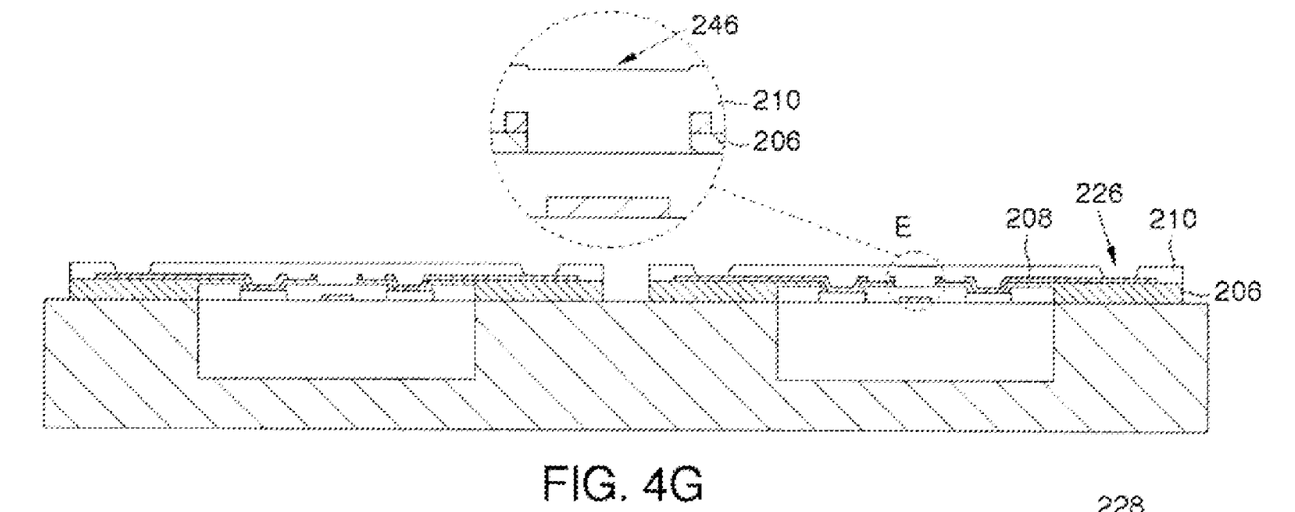

Then, in operation S314, as indicated in FIG. 3 and FIG. 4G, a second dielectric layer 210 is formed adjacent to the electrically conductive layer 208. The second dielectric layer 210 is formed with multiple, second apertures 226 for exposing contact surfaces of the electrically conductive layer 208. At least a portion or a subset of the second apertures 226 is laterally disposed outside of a periphery of the chip 202 so as to overlap the sealant 204, thereby allowing an increase in the number of input/output contacts.

In operation S314, a mask alignment tool (not illustrated) references any one or more of the alignment marks 216, 242, and 244 to position a mask at an exposure position to form the second dielectric layer 210.

As at least a portion of the second dielectric layer 210 is filled into the alignment mark 242, which is in the shape of a recess, a top surface of the second dielectric layer 210 has an indented area 246, as indicated in an enlarged view of a local area E of FIG. 4G. However, such indentation is by way of example, and the second dielectric layer 210 may lack such indentation, such as if the second dielectric layer 210 has a sufficient thickness.

Figure 4H:
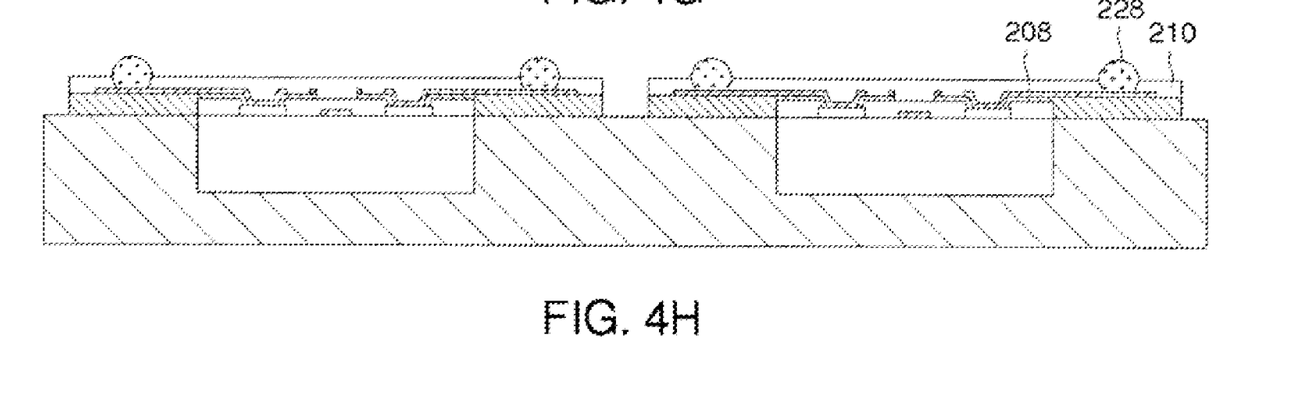

Then, in operation S316, as indicated in FIG. 3 and FIG. 4H, multiple solder balls 228 are disposed adjacent to the second dielectric layer 210 and accommodated within the second apertures 226, so that the solder balls 228 are electrically connected to the electrically conductive layer 208.

Then, in operation 5318, as indicated in FIG. 3 and FIG. 4I, the redistribution structure 240, along with the first dielectric layer 206 and the second dielectric layer 210, are sawn or singulated into multiple, individual semiconductor packages 200 along a sawing path P.

The sawing path P extends through overlapping portions of the first dielectric layer 206, the second dielectric layer 210, and the sealant 204, so that, on the sides of the sawn semiconductor package 200, side surfaces 230 of the first dielectric layer 206, side surfaces 232 of the second dielectric layer 210, and side surfaces 234 of the sealant 204 are substantially aligned with respect to one another.

Figure 6:
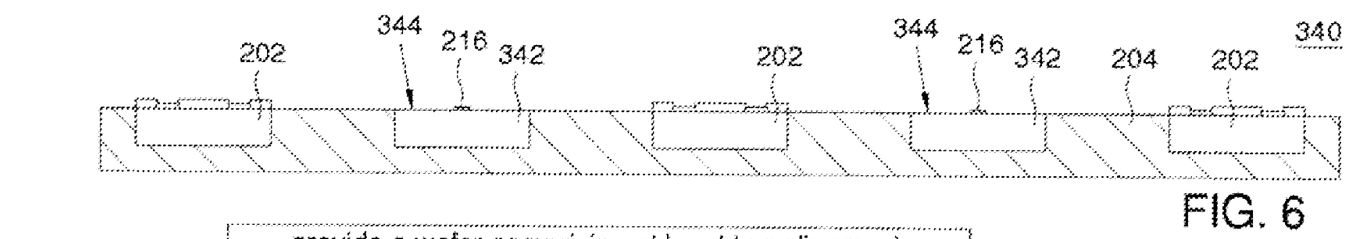
FIG. 6 shows a redistribution structure according to another embodiment of the disclosure.

Referring to FIG. 6, a redistribution structure 340 according to a second embodiment of the disclosure is shown. In the second embodiment, for components similar to those of the first embodiment, similar designations are used, and further discussion on those components is not repeated here. In contrast to the redistribution structure 240 of the first embodiment, the redistribution structure 340 of the second embodiment includes at least two alignment dies 342 each having an alignment mark 216, while semiconductor chips 202 within the redistribution structure 340 need not include alignment marks.

Each of the alignment dies 342 includes an alignment mark 216 located substantially at a geometric center of an alignment surface 344 of the corresponding alignment die 342. Thus, even if the redistributed alignment die 342 is rotated, such as about the geometric center, a resulting bias angle can be mitigated so as to avoid incurring severe bias in subsequent patterns being manufactured.

Figure 7:
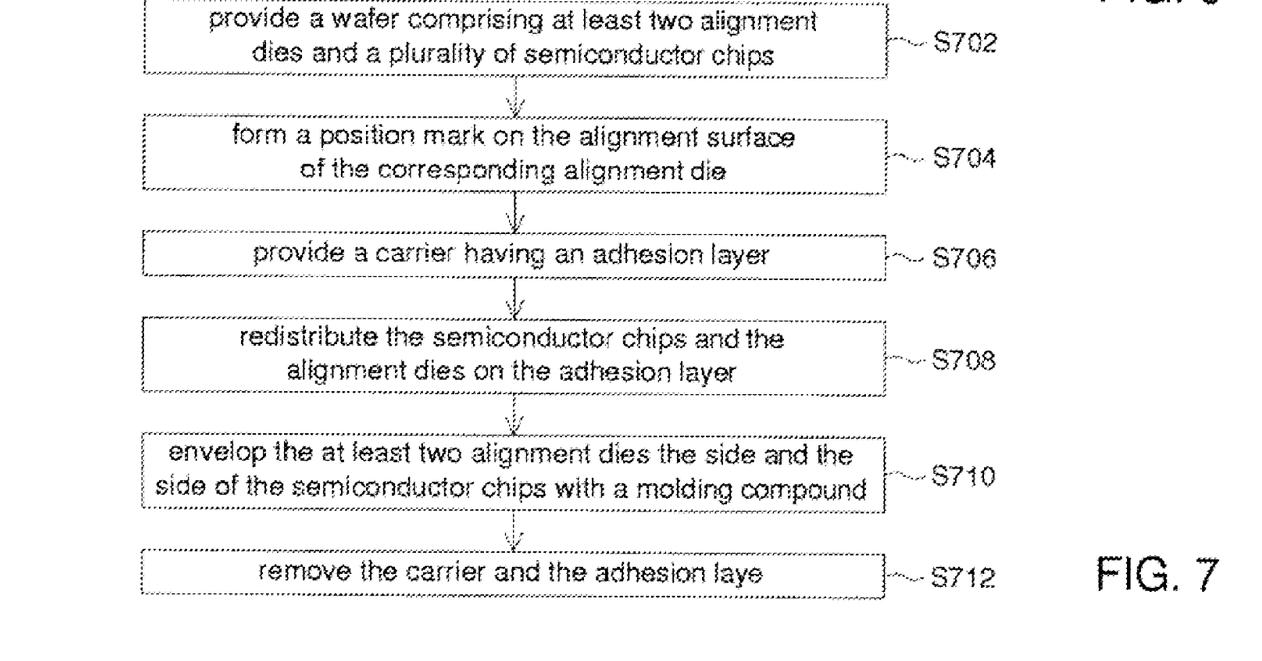
FIG. 7 shows a flow chart of a manufacturing method to form the redistribution structure of FIG. 6, according to an embodiment of the disclosure.

Referring to FIG. 7, a manufacturing method of the redistribution structure 340 according to the second embodiment of the disclosure is shown. Referring to FIG. 8A through FIG. 8D, various operations or stages of the manufacturing method are shown.

Figure 8A:
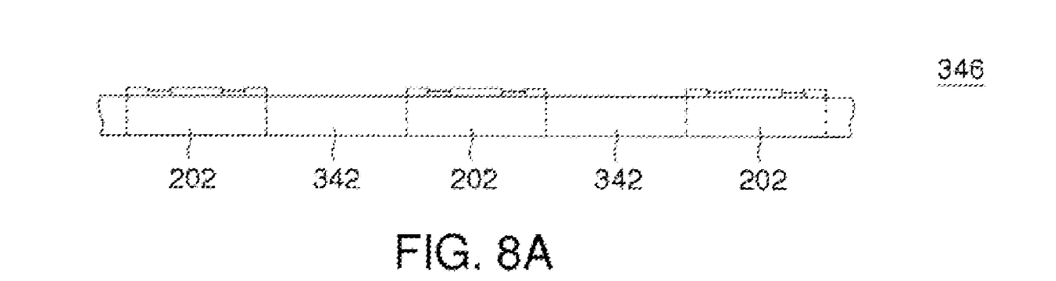
FIG. 8A through FIG. 8D show operations of a manufacturing method to form the redistribution structure of FIG. 6, according to an embodiment of the disclosure.

First, in operation S702, as indicated in FIG. 7 and FIG. 8A, a wafer 346 including at least two alignment dies 342 and multiple semiconductor chips 202 is provided.

Figure 8B:
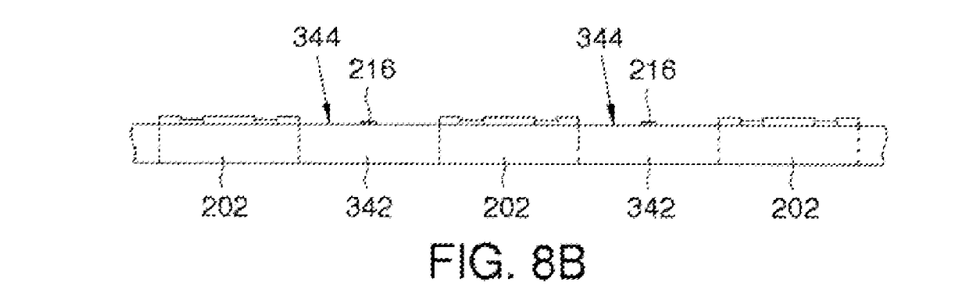

Next, in operation S704, as indicated in FIG. 7 and FIG. 8B, an alignment mark 216 is formed on an alignment surface 344 of each of the alignment dies 342. The alignment marks 216 are located substantially at geometric centers of the corresponding alignment surfaces 344. The alignment marks 216, which can be used for aligning a mask in subsequent processes, can be similarly implemented as in the first embodiment, and further discussion will not be repeated here.

Figure 8C:
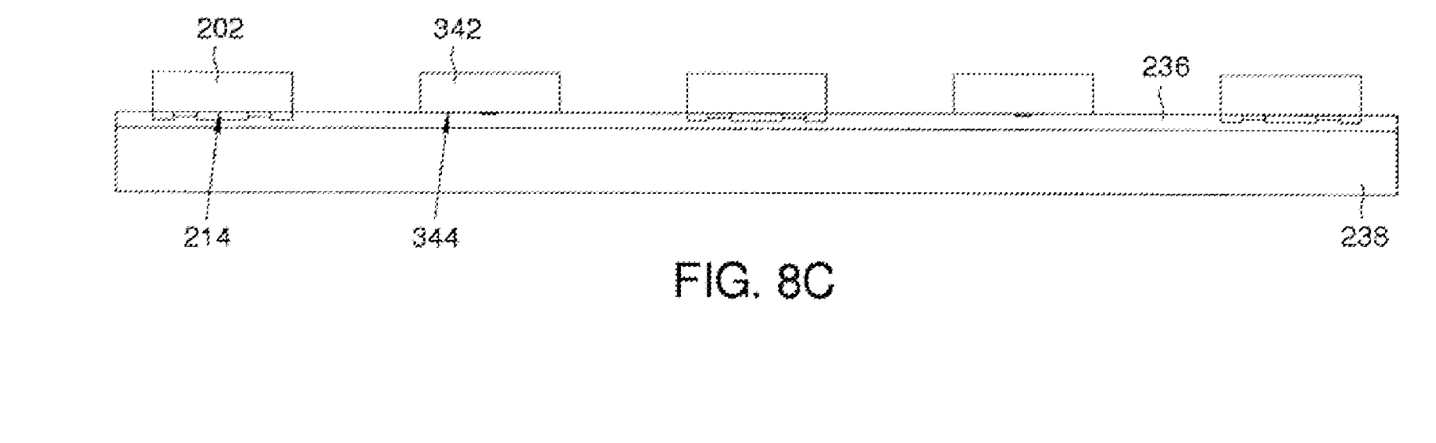

Then, in operation S706, as indicated in FIG. 7 and FIG. 8C, a carrier 238 along with an adhesion layer 236 are provided.

Afterwards, in operation S708, the wafer 346 is sawn into multiple semiconductor chips 202 and multiple alignment dies 342 according to positions of the semiconductor chips 202 and the alignment dies 342 in the wafer 346. After that, the semiconductor chips 202 and the alignment dies 342 are redistributed on the adhesion layer 236, as indicated in FIG. 8C, with the active surfaces 214 and the alignment surfaces 344 facing the adhesion layer 236.

Figure 8D:
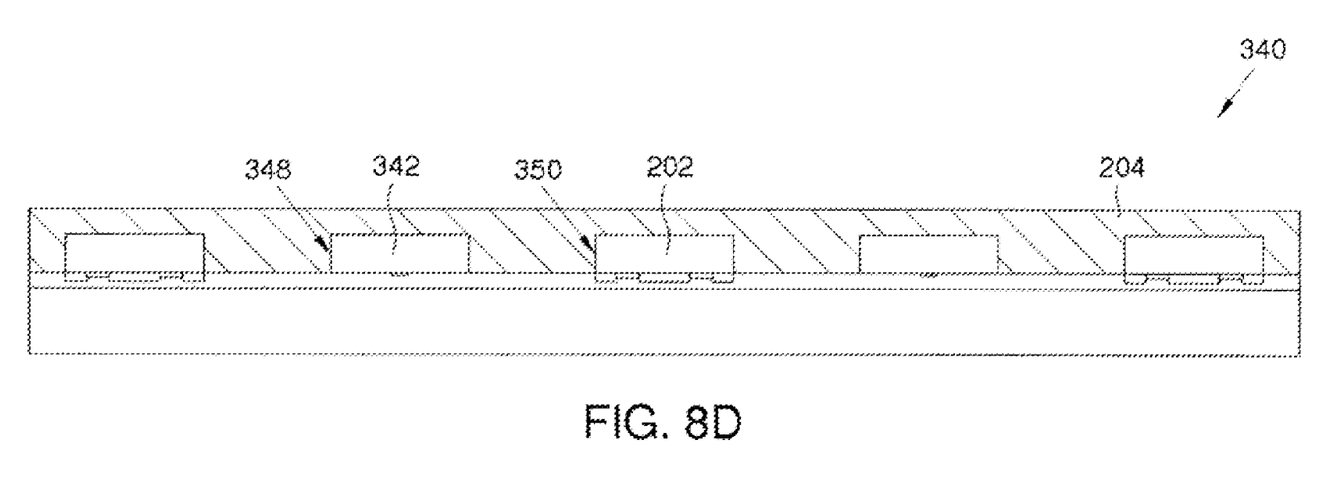

Then, in operation S710, as indicated in FIG. 7 and FIG. 8D, side surfaces 348 of the alignment dies 342 and side surfaces 350 of the semiconductor chips 202 are enveloped with a sealant 204, so that the sealant 204, the alignment dies 342, and the semiconductor chips 202 together form a redistribution structure 340.

Next, in operation S712, the carrier 238 and the adhesion layer 236 are removed, so that the redistribution structure 340 exposes the active surfaces 214 and the alignment surfaces 342 as indicated in FIG. 6. The redistribution structure 340 of FIG. 6 is obtained by inverting the redistribution structure 340 of FIG. 8D.

According to the disclosures of the first embodiment and the second embodiment, an alignment mark 216 can be formed as part of an alignment die 342 or as part of a semiconductor chip 202, so that the location of the alignment mark 216 can be implemented in many different ways, thereby further increasing the flexibility in the design of a manufacturing process.

Figure 9:
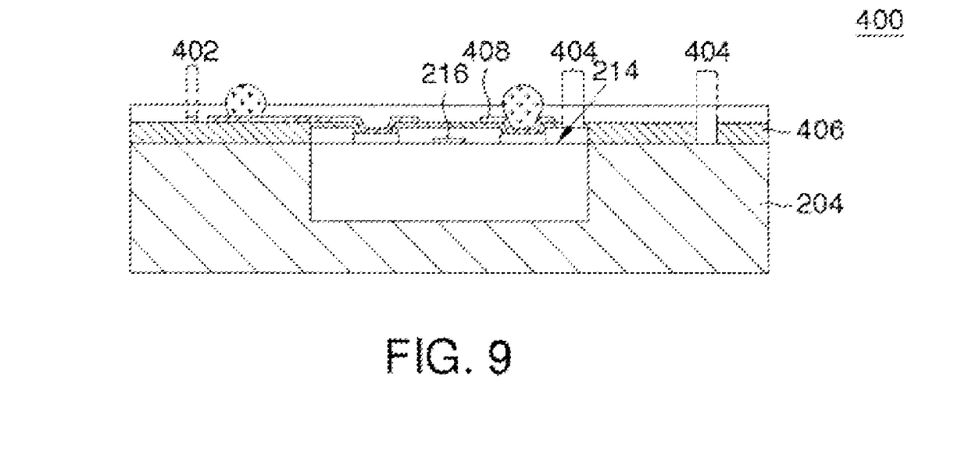
FIG. 9 shows a semiconductor device package according to another embodiment of the disclosure.

Referring to FIG. 9, a semiconductor device package 400 according to a third embodiment of the disclosure is shown. In the third embodiment, for components similar to those of the first embodiment and the second embodiment, similar designations are used, and further discussion on those components is not repeated here. In contrast to the semiconductor package 200 of the first embodiment, the semiconductor package 400 of the third embodiment includes an alignment mark 402 and an alignment mark 216 that are interlaced and laterally spaced apart along an extending direction of a first dielectric layer 406, and alignment marks 404 and the alignment mark 216 that are interlaced and laterally spaced apart along an extending direction of an electrically conductive layer 408.

Furthermore, a silhouette and location of the alignment mark 242 and the alignment mark 244 of the first embodiment can correspond to that of the alignment mark 216. In the third embodiment, the locations of the alignment marks 404 and the alignment mark 402 can be interlaced and laterally spaced apart relative to the alignment mark 216, and the silhouettes of the alignment marks 404 and the alignment mark 402 can be different from that of the alignment mark 216.

More particularly, during the formation of the first dielectric layer 406, the alignment marks 404 need not be formed through an alignment pattern (not illustrated) on a mask, but instead can be formed through another set of mask patterns (not illustrated) on the mask. Therefore, the silhouette and location of the alignment marks 404 do not have to correspond to that of the alignment mark 216. The alignment marks 404 formed under such circumstances can be used for aligning a mask in the next exposing process, hence further increasing the flexibility in the design of a mask for the alignment marks 404.

Moreover, in the third embodiment of the disclosure, the alignment marks 404 are shown by way of example as concurrently overlapping an active surface 214 and a sealant 204 (e.g., as viewed from the top). However, the disclosure is not restricted by this example, and, in other implementations, the alignment marks 404 can overlap one of the active surface 214 and the sealant 204, but not both.

Also, during the formation of the electrically conductive layer 408, the alignment mark 402 need not be formed through an alignment pattern (not illustrated) on a mask, but instead can be formed through another set of mask patterns (not illustrated) on the mask. Therefore, the silhouette and location of the alignment mark 402 do not have to correspond to that of the alignment mark 216. The alignment mark 402 formed under such circumstances can be used for aligning a mask in the next exposing process, hence further increasing the flexibility in the design of a mask for the alignment mark 402.

Besides, in the present embodiment of the disclosure, the alignment mark 402 is shown by way of example as overlapping the sealant 204. However, the disclosure is not restricted by this example, and, in other implementations, the alignment mark 402 can overlap the active surface 214 instead or can concurrently overlap both the active surface 214 and the sealant 204.

Whether or not the locations and silhouettes of the alignment marks 404 and the alignment mark 402 correspond to that of the alignment mark 216 can be determined according to criteria of a manufacturing process, and the disclosure does not impose further restrictions. For example, in other implementations, the location and silhouette of at least one of the alignment marks 404 can correspond to that of the alignment mark 216, but the location and silhouette of the alignment mark 402 can differ from that of the alignment mark 216. Or, the locations and silhouettes of the alignment marks 404 can differ from that of the alignment mark 216, but the location and silhouette of the alignment mark 402 can correspond to that of the alignment mark 216.

The formation of the alignment marks 404 and the formation of the alignment mark 402 can be similarly implemented according to operation S310 and operation S312 of the first embodiment, respectively, and further discussion on their formation is not repeated here.

The semiconductor packages, redistribution structures, and manufacturing methods disclosed in the above embodiments have many beneficial features, such as one or more of the below:

(1) An alignment mark is formed substantially at a geometric center of a semiconductor device, such as an alignment die or a semiconductor chip, so that a relative position between alignment marks can be less affected by rotation bias of redistributed devices. As such, a mask and the alignment marks can be more precisely aligned in a subsequent exposing process, thereby increasing a dimensional precision of a structural pattern being formed.

(2) An alignment mark can be formed as part of a semiconductor chip with circuit function, rather than as part of an alignment die lacking circuit function, so that, during the manufacturing of a wafer, semiconductor chips can be formed in the space originally reserved for the formation of alignment dies. As such, a greater number of semiconductor packages can be obtained according to embodiments of the disclosure.

(3) The locations and silhouettes of an alignment mark of a first dielectric layer and an alignment mark of an electrically conductive layer can correspond to that of an alignment mark of a semiconductor device. Or, the locations and silhouettes can differ, so as to increase the flexibility in the design of masks for the alignment marks.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device package, comprising:
   a semiconductor device including a contact pad, an active surface, and side surfaces, wherein the contact pad is disposed adjacent to the active surface, and the semiconductor device is formed with a first alignment mark that is disposed adjacent to the active surface;
   a sealant enveloping the side surfaces of the semiconductor device and exposing the contact pad;
   a first dielectric layer disposed adjacent to the sealant and the active surface, wherein the first dielectric layer defines a first aperture that exposes the contact pad;
   an electrically conductive layer disposed adjacent to the first dielectric layer and electrically connected to the contact pad through the first aperture; and
   a second dielectric layer disposed adjacent to the electrically conductive layer,
   wherein the first dielectric layer is formed with a second alignment mark, and a silhouette and a location of the second alignment mark substantially correspond to a silhouette and a location of the first alignment mark.

2. The semiconductor device package according to claim 1, wherein the second alignment mark defines a recess that exposes the first alignment mark.

3. The semiconductor device package according to claim 1, wherein the second alignment mark defines a recess that extends through the first dielectric layer to expose the first alignment mark.

4. The semiconductor device package according to claim 3, wherein the recess is at least partially filled with a portion of the second dielectric layer.

5. The semiconductor device package according to claim 1, wherein the second alignment mark defines a recess that is at least partially filled with a portion of the second dielectric layer, and the second dielectric layer includes an indented area disposed adjacent to a top surface of the second dielectric layer and corresponding to the recess.

6. A semiconductor device package, comprising:
   a semiconductor device including a contact pad, an active surface, and side surfaces, wherein the contact pad is disposed adjacent to the active surface, and the semiconductor device is formed with a first alignment mark that is disposed adjacent to the active surface;
   a sealant enveloping the side surfaces of the semiconductor device and exposing the contact pad;
   a first dielectric layer disposed adjacent to the sealant and the active surface, wherein the first dielectric layer defines a first aperture that exposes the contact pad;
   an electrically conductive layer disposed adjacent to the first dielectric layer and electrically connected to the contact pad through the first aperture; and
   a second dielectric layer disposed adjacent to the electrically conductive layer,
   wherein the first dielectric layer is formed with a second alignment mark, and the first alignment mark and the second alignment mark are spaced apart along a direction substantially parallel to the active surface.

7. A semiconductor device package, comprising:
   a semiconductor device including a contact pad, an active surface, and side surfaces, wherein the contact pad is disposed adjacent to the active surface, and the semiconductor device is formed with a first alignment mark that is disposed adjacent to the active surface;
a sealant enveloping the side surfaces of the semiconductor device and exposing the contact pad;
a first dielectric layer disposed adjacent to the sealant and the active surface, wherein the first dielectric layer defines a first aperture that exposes the contact pad;
an electrically conductive layer disposed adjacent to the first dielectric layer and electrically connected to the contact pad through the first aperture; and
a second dielectric layer disposed adjacent to the electrically conductive layer,
wherein the electrically conductive layer is formed with a second alignment mark, and the first alignment mark and the second alignment mark are spaced apart along a direction substantially parallel to the active surface.

8. A semiconductor device package, comprising:
a semiconductor device including a contact pad, an active surface, and side surfaces, wherein the contact pad is disposed adjacent to the active surface, and the semiconductor device is formed with a first alignment mark that is disposed adjacent to the active surface;
a sealant enveloping the side surfaces of the semiconductor device and exposing the contact pad;
a first dielectric layer disposed adjacent to the sealant and the active surface, wherein the first dielectric layer defines a first aperture that exposes the contact pad;
an electrically conductive layer disposed adjacent to the first dielectric layer and electrically connected to the contact pad through the first aperture; and
a second dielectric layer disposed adjacent to the electrically conductive layer,
wherein the electrically conductive layer is formed with a second alignment mark, and a silhouette and a location of the second alignment mark substantially correspond to a silhouette and a location of the first alignment mark.

9. The semiconductor device package according to claim 8, wherein the first dielectric layer is formed with a recess, a silhouette and a location of the recess substantially correspond to a silhouette and a location of the first alignment mark, the first alignment mark is exposed by the recess, and the recess is surrounded by the second alignment mark.

10. A semiconductor device package, comprising:
a semiconductor device including a contact pad, an active surface, and side surfaces, wherein the contact pad is disposed adjacent to the active surface, and the semiconductor device is formed with a first alignment mark that is disposed adjacent to the active surface;
a sealant enveloping the side surfaces of the semiconductor device and exposing the contact pad;
a first dielectric layer disposed adjacent to the sealant and the active surface, wherein the first dielectric layer defines a first aperture that exposes the contact pad;
an electrically conductive layer disposed adjacent to the first dielectric layer and electrically connected to the contact pad through the first aperture; and
a second dielectric layer disposed adjacent to the electrically conductive layer,
wherein the first dielectric layer is formed with a second alignment mark that defines a recess, and the recess at least partially extends through the first dielectric layer, wherein the recess is at least partially filled with a portion of the second dielectric layer.

11. A semiconductor package, comprising:
a molding compound;
a semiconductor device including a contact disposed on an active surface of the semiconductor device, and further including a first alignment mark that is disposed adjacent to the active surface, the semiconductor device being embedded in the molding compound; and
a redistribution layer extending from the contact to a conductive connector positioned outside a lateral periphery of the semiconductor device, the redistribution layer being formed with a second alignment mark.

12. The semiconductor package according to claim 11, wherein the first alignment mark is disposed adjacent to a geometric center of the active surface.

13. The semiconductor package according to claim 11, wherein:
the active surface has a width in a first direction and a length in a second direction substantially perpendicular to the first direction; and
the first alignment mark is substantially colocated with a geometric center of the active surface such that a separation between the first alignment mark and the geometric center of the active surface is no greater than 20 percent of the width and no greater than 20 percent of the length.

14. The semiconductor package according to claim 11, wherein the first alignment mark is laterally spaced apart from the second alignment mark.

15. A semiconductor package, comprising:
a redistribution layer including a first surface and a second opposing surface;
a semiconductor device electrically connected to the redistribution layer, the redistribution layer extending outside a lateral periphery of the semiconductor device, the semiconductor device including means for reducing an effect of rotational bias between the semiconductor device and an alignment mark on another device on formation of the redistribution layer; and
a molding compound encapsulating the semiconductor device, the semiconductor device being positioned between the molding compound and the redistribution layer.

16. The semiconductor package according to claim 15, further comprising a dielectric layer disposed adjacent to the first surface of the redistribution layer, wherein the redistribution layer is formed with means for reducing an effect of rotational bias between the semiconductor device and the alignment mark on the another device on formation of the dielectric layer.

17. The semiconductor package according to claim 15, further comprising a dielectric layer disposed adjacent to the second opposing surface of the redistribution layer and extending between the redistribution layer and the semiconductor device, wherein the dielectric layer is formed with means for reducing an effect of rotational bias between the semiconductor device and the alignment mark on the another device on formation of the redistribution layer.

* * * * *